(12) United States Patent
Sung

(10) Patent No.: US 7,253,815 B2
(45) Date of Patent: Aug. 7, 2007

(54) OLED DISPLAY AND PIXEL STRUCTURE THEREOF

(75) Inventor: Chih-Feng Sung, Miaoli (TW)

(73) Assignee: AU Optronics Corp., Hsinchu (TW)

( * ) Notice: Subject to any disclaimer, the term of this patent is extended or adjusted under 35 U.S.C. 154(b) by 609 days.

(21) Appl. No.: 10/797,160

(22) Filed: Mar. 10, 2004

(65) Prior Publication Data

US 2004/0246209 A1    Dec. 9, 2004

(30) Foreign Application Priority Data

Jun. 5, 2003    (TW) .............................. 92115178 A

(51) Int. Cl.
*G09G 5/00*    (2006.01)

(52) U.S. Cl. ...................... 345/215; 345/204; 345/211; 345/212; 345/214

(58) Field of Classification Search .................. 345/76, 345/87, 92, 95, 204, 214, 82, 211, 212; 315/169.3; 257/13, 59, 72; 323/312; 327/143
See application file for complete search history.

(56) References Cited

U.S. PATENT DOCUMENTS

| | | | | |
|---|---|---|---|---|
| 5,463,335 | A * | 10/1995 | Divakaruni et al. | ......... 327/143 |
| 6,097,179 | A * | 8/2000 | Ray et al. | .................... 323/312 |
| 6,157,356 | A | 12/2000 | Troutman | |
| 6,879,110 | B2 * | 4/2005 | Koyama | ................... 315/169.1 |
| 7,158,104 | B2 * | 1/2007 | Koyama | ........................ 345/76 |
| 2001/0022565 | A1 * | 9/2001 | Kimura | ........................ 345/82 |
| 2002/0135312 | A1 * | 9/2002 | Koyama | ................... 315/169.3 |
| 2003/0107565 | A1 * | 6/2003 | Libsch et al. | ................ 345/211 |
| 2003/0146912 | A1 * | 8/2003 | Sung et al. | ................. 345/212 |
| 2003/0156101 | A1 * | 8/2003 | LeChevalier | ................ 345/204 |
| 2003/0197666 | A1 * | 10/2003 | Akimoto et al. | .............. 345/82 |
| 2003/0205708 | A1 * | 11/2003 | Lee et al. | ...................... 257/72 |
| 2003/0234392 | A1 * | 12/2003 | Kung et al. | ................... 257/13 |
| 2004/0232420 | A1 * | 11/2004 | Lee et al. | ...................... 257/59 |
| 2006/0027807 | A1 * | 2/2006 | Nathan et al. | ................ 257/59 |

FOREIGN PATENT DOCUMENTS

| | | |
|---|---|---|
| JP | 02/213821 | 8/1990 |
| JP | 2000-221903 | 8/2000 |
| TW | 521536 | 8/1990 |

OTHER PUBLICATIONS

China Office Action mailed Dec. 8, 2006.

* cited by examiner

*Primary Examiner*—Sumati Lefkowitz
*Assistant Examiner*—Prabodh Dharia
(74) *Attorney, Agent, or Firm*—Thomas, Kayden, Horstemeyer & Risley

(57) ABSTRACT

An active matrix organic light-emitting diode (OLED) display and pixel structure thereof. The pixel structure comprises a first transistor, a storage capacitor, a second transistor, and an OLED. The first transistor has a gate terminal coupled to a scan signal and a drain terminal coupled to a data signal. The storage capacitor has two terminals coupled to a source terminal of the first transistor and a reference node with a second voltage. The second transistor has a gate terminal coupled to the source terminal of the first transistor and a source terminal coupled to the reference node. The OLED has a cathode coupled to a drain terminal of the second transistor and an anode coupled to a first voltage, higher than the second voltage. The second transistor is an amorphous silicon thin film transistor (a-Si TFT), and an equivalent channel width/length (W/L) ratio of the second transistor exceeds 10.

16 Claims, 7 Drawing Sheets

OLED DISPLAY AND PIXEL STRUCTURE THEREOF

BACKGROUND OF THE INVENTION

1. Field of the Invention

The present invention relates to an active matrix organic light-emitting diode (OLED) display and in particular to a less costly and easily manufactured active matrix OLED display.

2. Description of the Related Art

Organic light-emitting diodes (OLED) are active lighting elements, which, when receiving a voltage, inject an electron into an organic semiconductor through a cathode, and into an electron hole through an anode. The electron and the electron hole form an electron-hole pair in an organic thin film, and produce photons by radiative recombination.

Compared with a conventional inorganic LED, the OLED is easily formed on large panels. As well, displays utilizing OLEDs require no backlight module, such that process is simpler and costs are reduced.

OLEDs can be applied to small panels such as those in personal digital assistant (PDA) or digital camera applications.

In conventional OLED display, a pixel is formed by two thin film transistors (TFT). The first TFT switches the pixel, and the second TFT controls the power applied to the OLED. Two types of common TFTs are applied to OLED displays, amorphous silicon thin film transistor (a-Si TFT) and low-temperature Poli-silicon (LTPS) TFT. The carrier mobility of the LTPS TFT is 100 times that of a-Si TFT, such that the LTPS TFT can supply the OLED with sufficient current, making it a better choice as a control element of the active matrix OLED display. However, manufacture of the LTPS TFT is very complicated, lowering product reliability and increasing costs.

SUMMARY OF THE INVENTION

The pixel structure of the present invention comprises a first transistor, a storage capacitor, a second transistor and an OLED. The first transistor has a gate terminal coupled to a scan signal and a drain terminal coupled to a data signal. The storage capacitor has two terminals coupled to a source terminal of the first transistor and a reference node, which has a second voltage. The second transistor has a gate terminal coupled to the source terminal of the first transistor and a source terminal coupled to the reference node. The OLED has a cathode coupled to a drain terminal of the second transistor and an anode coupled to a first voltage, higher than the second voltage. The second transistor is an amorphous silicon thin film transistor (a-Si TFT), and an equivalent channel width/length (W/L) ratio of the second transistor exceeds 10.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
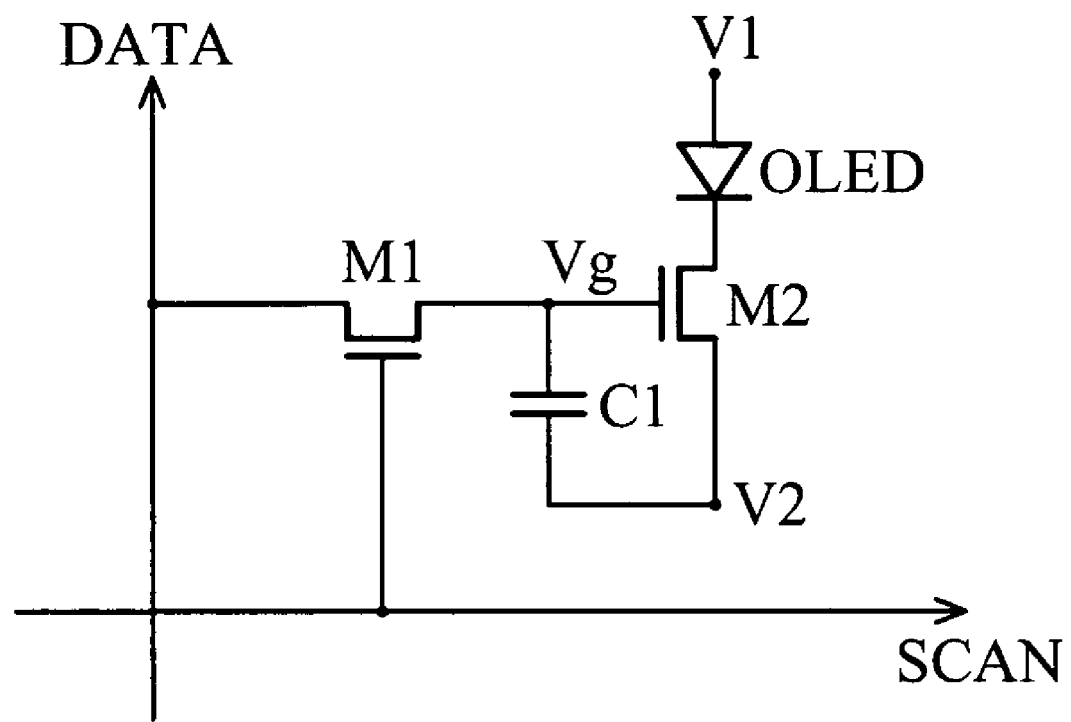
FIG. 1a shows the first embodiment of the present invention.

FIG. 1 shows a first example of the present invention. The pixel structure comprises a first transistor (switching transistor) M1, a storage capacitor C1, a second transistor (driving transistor) M2 and an organic light-emitting diode (OLED). The first transistor has a gate terminal coupled to a scan signal SCAN and a drain terminal coupled to a data signal DATA. The first transistor M1 controls the transmission of data signal DATA according to the scan signal SCAN. The storage capacitor C1 has two terminals coupled to a source terminal of the first transistor M1 and a reference node. The reference node has a second voltage V2. The second transistor M2 has a gate terminal coupled to the source terminal of the first transistor M1 and a source terminal coupled to the reference node. The OLED has a cathode coupled to a drain terminal of the second transistor M2 and an anode coupled to a first voltage V1. The first voltage V1 exceeds the second voltage V2. The second transistor controls the current through the OLED according to the data signal DATA. The second transistor M2 is an amorphous silicon thin film transistor (a-Si TFT), and an equivalent channel width/length (W/L) ratio of the second transistor M2 exceeds 10.

The second voltage V2 is a ground or a low voltage.

The first voltage is a power supply voltage.

Figure 1B:
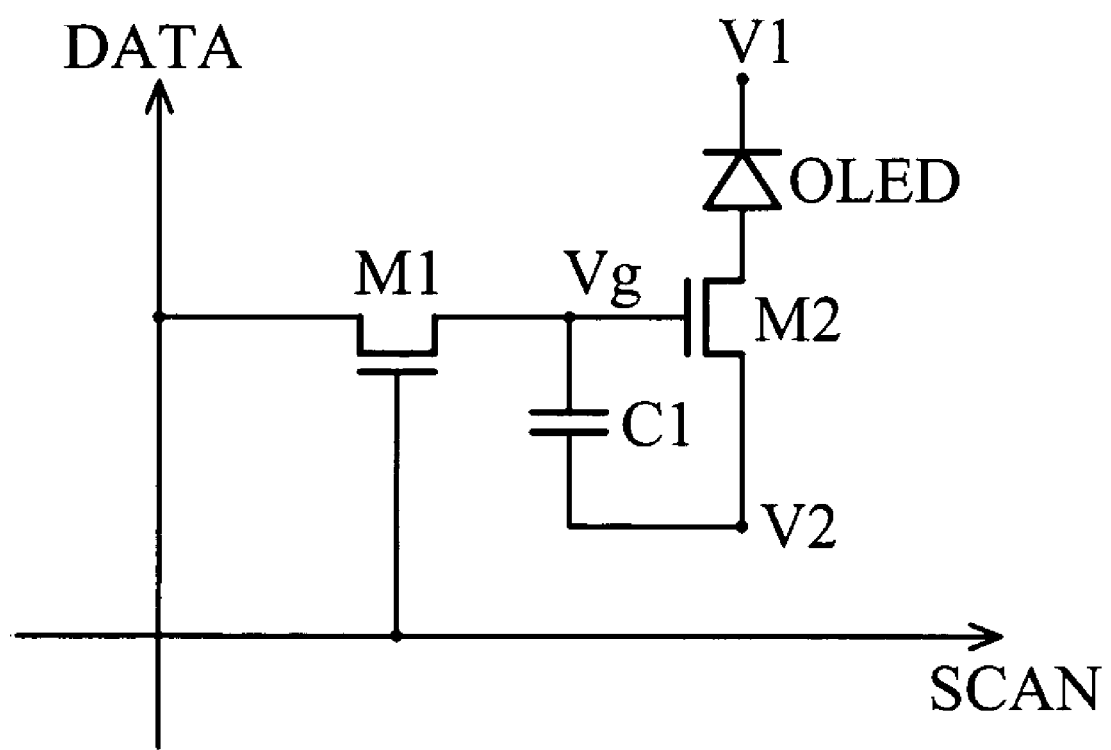
FIG. 1b shows the second embodiment of the present invention.

FIG. 1b shows a second embodiment of the present invention, wherein the OLED is connected to the source terminal of the second transistor M2 via the anode, and connected to the first voltage V1 via the cathode. The drain terminal of the second transistor M2 is connected to the reference node. The second voltage V2 exceeds the first voltage V1.

When a voltage of the scan signal SCAN received by the gate terminal of the first transistor M1 exceeds an active voltage of the first transistor M1, the first transistor M1 transmits the data signal DATA to the storage capacitor C1. Then, when a stored voltage Vg in the storage capacitor C1 exceeds an active voltage of the second transistor M2, the second transistor M2 transmits an actuation current through the OLED according to the stored voltage Vg. Thus, brightness of the OLED is controlled by the data signal DATA.

Applied with the same voltage, the a-Si TFT transmits less current than the LTPS TFT transmits, however, by increasing an equivalent channel width/length (W/L) ratio of the a-Si TFT, sufficient actuation current is provided to actuate the OLED.

Table 1 shows a simulation result of current needed to actuate display. As shown in Table 1, the highest current request for actuating the OLED is about 6.13 µA. Thus, if the a-Si TFT can supply a current with 6.13 µA, it can be applied in an active matrix OLED display.

TABLE 1

| Maximum brightness of display (cd/m²) | | Required brightness from OLED (cd/m2) | Light efficiency of OLED (cd/A) | Current required to activate OLED (μA) |
|---|---|---|---|---|
| White light applied in mobile phone display (60) | R | 8 | 450 | 4 | 0.65 |
| | G | 6 | 900 | 15 | 0.34 |
| | B | | 150 | 4 | 0.22 |
| White light applied in notebook display (300) | R | 0 | 1687 | 4 | 6.13 |
| | G | 80 | 3374 | 15 | 3.3 |
| | B | 0 | 562 | 4 | 2 |

Figure 2:
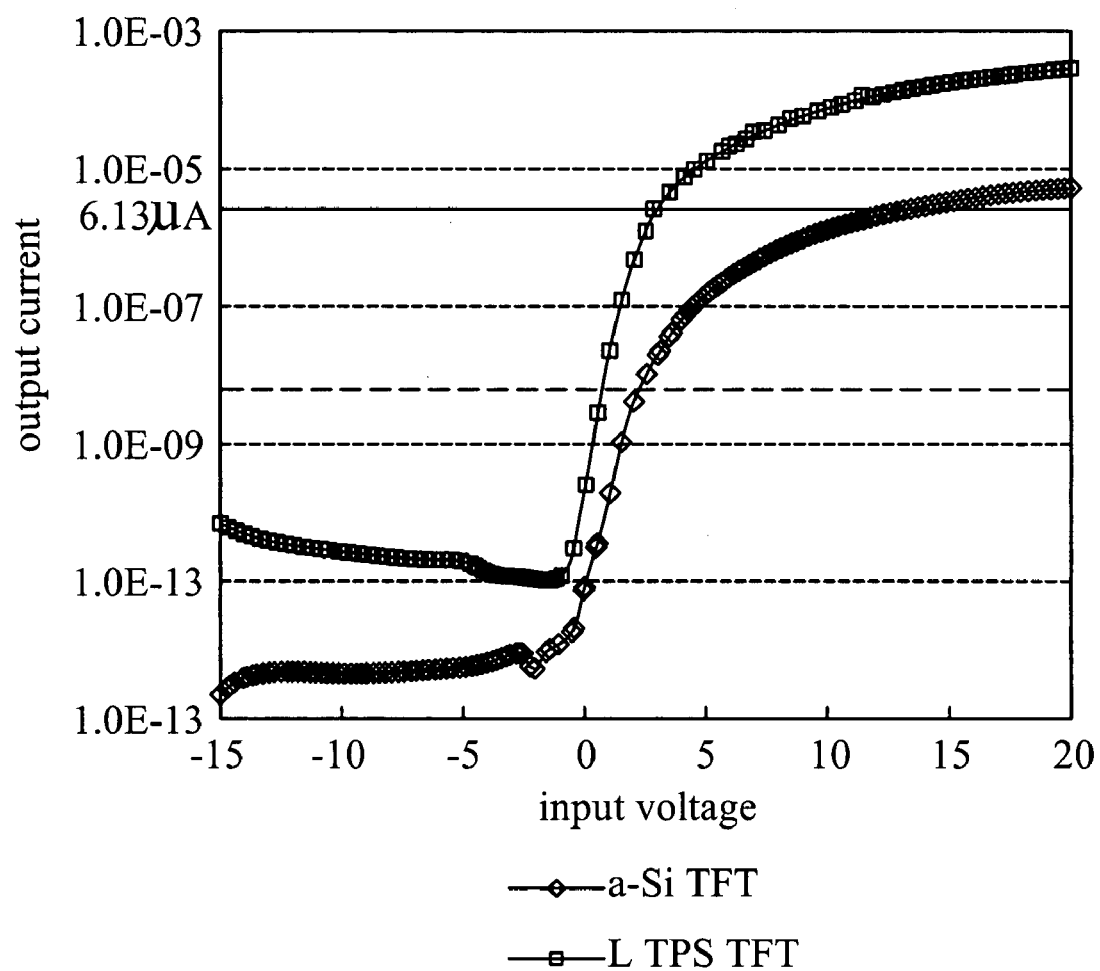
FIG. 2 shows electrical properties of the a-Si and LTPS TFTs.

As shown in FIG. 2, by raising input voltage above 13v, the a-Si TFT can output a 6.13 μA current. However, a high input voltage hastens degradation of the a-Si TFT, as shown in the following current function of the TFT:

$$I_D = \frac{1}{2} \cdot \mu \cdot k \cdot \left(\frac{W}{L}\right)(V_{GS} - V_{th})^2$$

Figure 3:
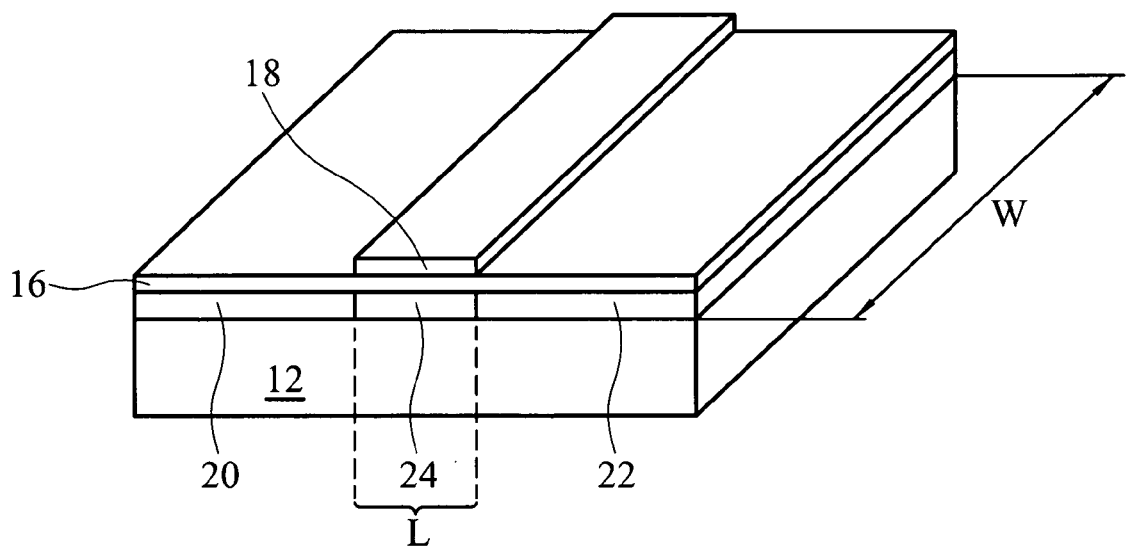
FIG. 3 shows the structure of the a-si TFT.
Figure 4:
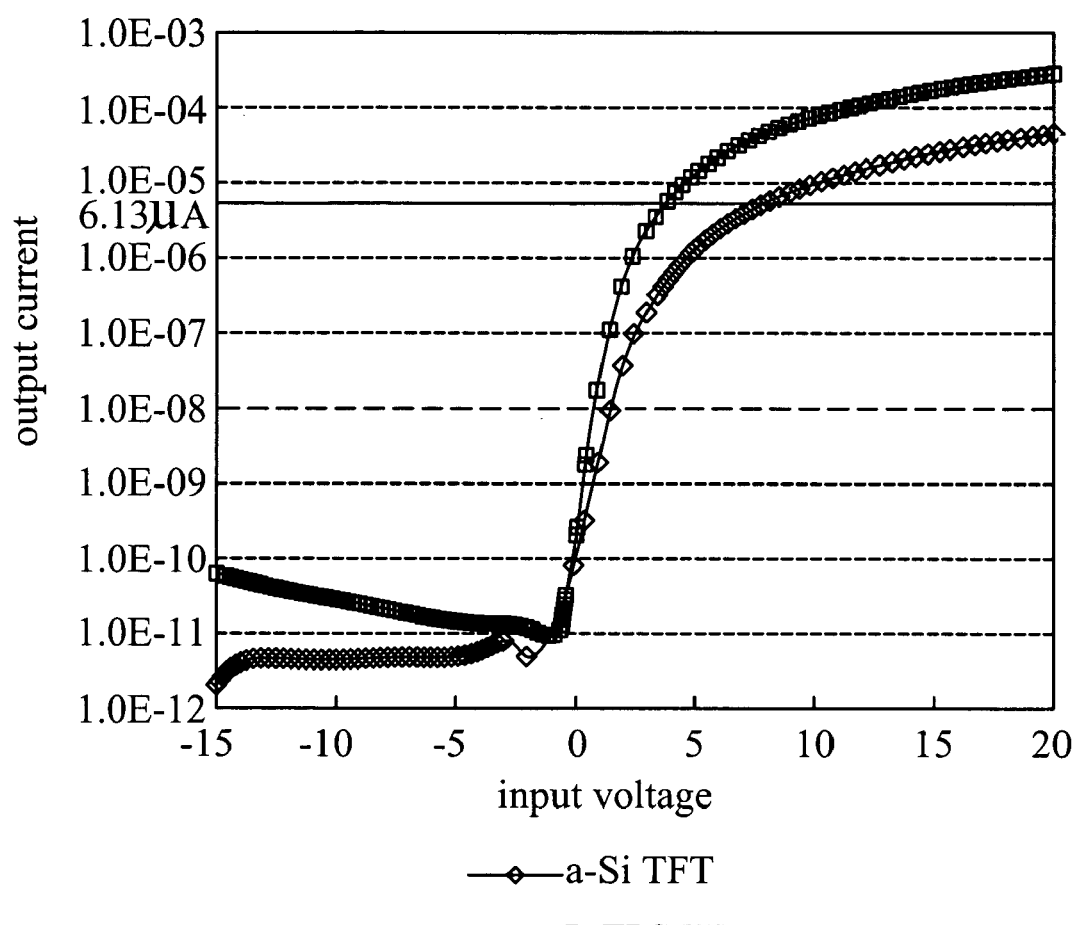
FIG. 4 shows electrical properties of an a-Si TFT with an equivalent channel width/length (W/L) ratio greater than 10 and a common a-Si TFT.

$I_D$ is output current, μ carrier mobility, $V_{GS}$ input voltage, $V_{th}$ threshold voltage, W channel width, and L channel length. Accordingly, the output current can be raised by increasing carrier mobility, equivalent channel width/length (W/L) ratio, or input voltage. Because the carrier mobility of the a-Si TFT is fixed between 0.5~1, it is difficult to raise the output current by increasing carrier mobility, and raising input voltage hastens degradation of the a-Si TFT. Thus, the optimum method of raising output current is to increase the equivalent channel width/length (W/L) ratio. FIG. 3 shows a structure of an a-Si TFT, comprising a substrate 12, source terminal 20, drain terminal 22, channel 24, gate isolation layer 16, and gate terminal 18. W is channel width and L channel length. In FIG. 4, when the equivalent channel width/length (W/L) ratio equals 10, the a-Si TFT outputs a 6.13 μA current by inputting only 7 volt input voltage. As to current leakage, performance of the a-Si TFT is superior to an LTPS TFT. Thus, the a-Si TFT can be applied in an OLED display by raising the W/L above 10. The less costly a-Si TFT commensurately reduces the price of the active matrix OLED display.

Figure 5A:
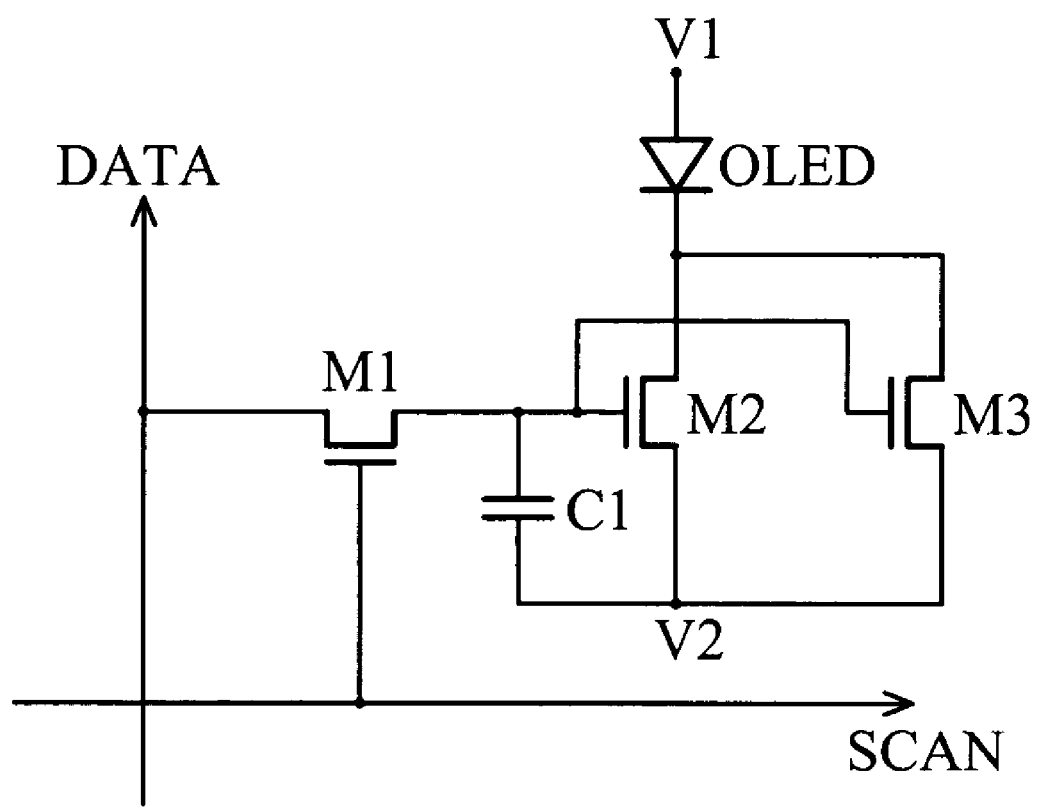
FIG. 5a shows the third embodiment of the present invention.

Parallel connection of two driving transistors reduces the equivalent channel width/length (W/L) ratio requirement. FIG. 5 shows the third embodiment of the present invention, which comprises a first transistor (switching transistor) M1, a storage capacitor C1, a second transistor (driving transistor) M2, a third transistor (driving transistor) M3 and an OLED. The first transistor has a gate terminal coupled to a scan signal SCAN and a drain terminal coupled to a data signal DATA. The first transistor M1 controls the transmission of data signal DATA according to the scan signal SCAN. The storage capacitor C1 has two terminals coupled to a source terminal of the first transistor M1 and a reference node. The reference node has a second voltage V2. The second transistor M2 and the third transistor M3 are connected in parallel. The second transistor M2 and the third transistor M3 have gate terminals coupled to the source terminal of the first transistor M1 and source terminals coupled to the reference node. The OLED has a cathode coupled to drain terminals of the second transistor M2 and the third transistor M3 and an anode coupled to a first voltage V1. The first voltage V1 exceeds the second voltage V2. The second transistor M2 and the third transistor M3 control current through the OLED according to the data signal DATA. The second transistor M2 and the third transistor M3 are an amorphous silicon thin film transistor (a-Si TFT), and equivalent channel width/length (W/L) ratios of the second transistor M2 and the third transistor M3 exceed 5.

The third embodiment reduces the W/L ratio requirement by parallel connection. When two driving transistors are connected in parallel, the W/L ratio requirement is only 10/2=5. The relation between the amount N of the driving transistors and equivalent channel width/length (W/L) ratio R is $$R \geq \frac{10}{N}.$$

The second voltage V2 is a ground or a low voltage, and the first voltage is a power supply voltage.

Figure 5B:
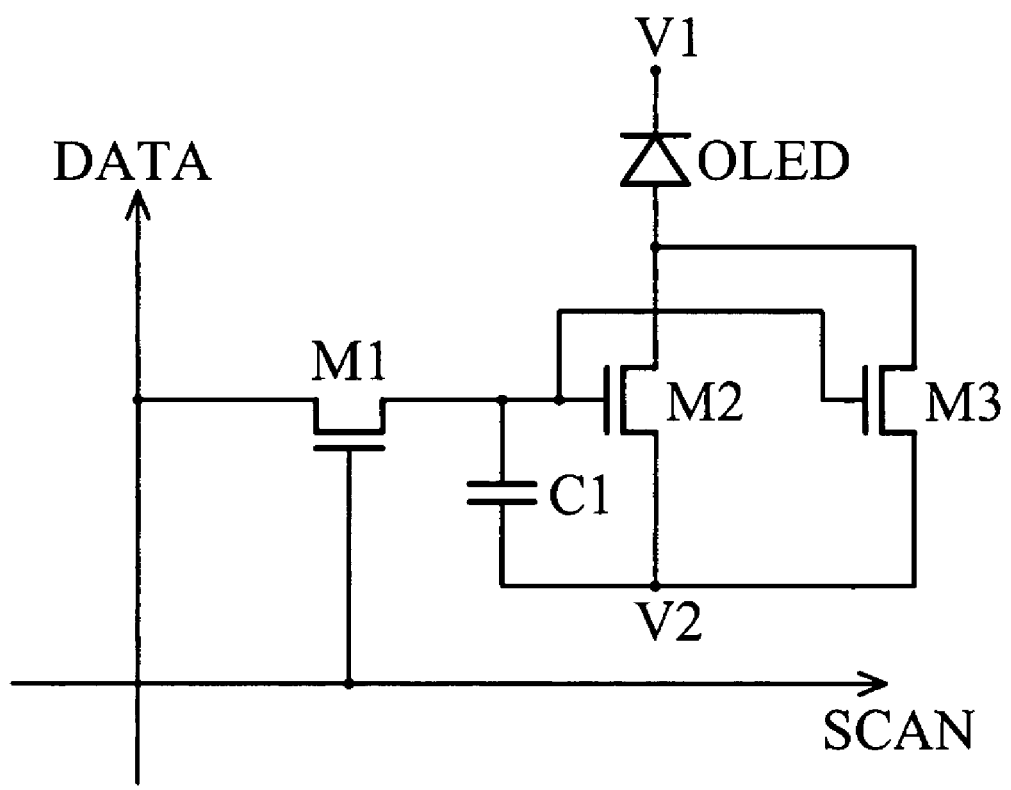
FIG. 5b shows the fourth embodiment of the present invention.

FIG. 5b shows a fourth embodiment of the present invention, wherein the OLED is connected to the source terminals of the second transistor M2 and the third transistor M3 via the anode, and to the first voltage V1 via the cathode. The drain terminals of the second transistor (driving transistor) M2 and the third transistor (driving transistor) M3 are connected to the reference node. The second voltage V2 exceeds the first voltage V1.

The present invention can also constitute display comprising the pixel structure disclosed.

The present invention utilizes a less complex TFT to control the signal of the active matrix OLED display, decreasing costs thereof.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pixel structure of an active matrix organic light-emitting diode (OLED) display, comprising:
    a first transistor having a gate terminal coupled to a scan signal and a drain terminal coupled to a data signal;
    a storage capacitor having two terminals coupled to a source terminal of the first transistor and a reference node respectively, the reference node having a second voltage;
    a second transistor having a gate terminal coupled to the source terminal of the first transistor and a source terminal coupled to the reference node; and
    an OLED having a cathode coupled to a drain terminal of the second transistor and an anode coupled to a first voltage exceeding the second voltage;
    wherein the second transistor is an amorphous silicon thin film transistor (a-Si TFT), and an equivalent channel width/length (W/L) ratio of the second transistor exceeds 10.

2. The pixel structure as claimed in claim 1, wherein the second voltage is a ground or a low voltage.

3. A pixel structure of an active matrix organic light-emitting diode (OLED) display, comprising:
   a switching transistor having a gate terminal coupled to a scan signal and a drain terminal coupled to a data signal;
   a storage capacitor having two terminals coupled to a source terminal of the switching transistor and a reference node respectively, the reference node having a second voltage;
   a plurality of driving transistors connected in parallel, each having a gate terminal coupled to the source terminal of the switching transistor, a source terminal coupled to the reference node, and a drain terminal; and
   an OLED having a cathode coupled to the drain terminals of the driving transistor and an anode coupled to a first voltage exceeding the second voltage;
   wherein the driving transistors are amorphous silicon thin film transistors (a-Si TFT), wherein the relationship between an equivalent channel width/length (W/L) ratio R of the driving transistor and the number of driving transistors N is $$R \geq \frac{10}{N}.$$

4. The pixel structure as claimed in claim 3, wherein the second voltage is a ground or a low voltage.

5. An active matrix organic light-emitting diode (OLED) display, comprising:
   a panel, comprising a plurality of pixels, each comprising a first transistor having a gate terminal coupled to a scan signal and a drain terminal coupled to a data signal; a storage capacitor having two terminals coupled to a source terminal of the first transistor and a reference node respectively, the reference node having a second voltage; a second transistor having a gate terminal coupled to the source terminal of the first transistor and a source terminal coupled to the reference node; and an OLED having a cathode coupled to a drain terminal of the second transistor and an anode coupled to a first voltage exceeding the second voltage; wherein the second transistor is an amorphous silicon thin film transistor (a-Si TFT), and an equivalent channel width/length (W/L) ratio of the second transistor exceeds 10.

6. The active matrix OLED display as claimed in claim 5, wherein the second voltage is a ground or a low voltage.

7. An active matrix organic light-emitting diode (OLED) display, comprising:
   a panel, comprising a plurality of pixels, each comprising a switching transistor having a gate terminal coupled to a scan signal and a drain terminal coupled to a data signal; a storage capacitor having two terminals coupled to a source terminal of the switching transistor and a reference node respectively, the reference node having a second voltage; a plurality of driving transistors connected in parallel, each having a gate terminal coupled to the source terminal of the switching transistor, a source terminal coupled to the reference node and a drain terminal; and an OLED having a cathode coupled to the drain terminals of the driving transistor and an anode coupled to a first voltage exceeding the second voltage; wherein the driving transistors are amorphous silicon thin film transistors (a-Si TFT), wherein the relationship between an equivalent channel width/length (W/L) ratio R of the driving transistor and the number of driving transistors N is $$R \geq \frac{10}{N}.$$

8. The active matrix OLED display as claimed in claim 7, wherein the second voltage is a ground or a low voltage.

9. A pixel structure of an active matrix organic light-emitting diode (OLED) display, comprising:
   a first transistor having a gate terminal coupled to a scan signal and a drain terminal coupled to a data signal;
   a storage capacitor having two terminals coupled to a source terminal of the first transistor and a reference node respectively, the reference node having a second voltage;
   a second transistor having a gate terminal coupled to the source terminal of the first transistor and a drain terminal coupled to the reference node; and
   an OLED having an anode coupled to a source terminal of the second transistor and a cathode coupled to a first voltage less than the second voltage;
   wherein the second transistor is an amorphous silicon thin film transistor (a-Si TFT), and an equivalent channel width/length (W/L) ratio of the second transistor exceeds 10.

10. The pixel structure as claimed in claim 9, wherein the second voltage is a high voltage.

11. A pixel structure of an active matrix organic light-emitting diode (OLED) display, comprising:
    a switching transistor having a gate terminal coupled to a scan signal and a drain terminal coupled to a data signal;
    a storage capacitor having two terminals coupled to a source terminal of the switching transistor and a reference node respectively, the reference node having a second voltage;
    a plurality of driving transistors connected in parallel, each having a gate terminal coupled to the source terminal of the switching transistor, a drain terminal coupled to the reference node, and a source terminal; and
    an OLED having an anode coupled to the source terminals of the driving transistor and a cathode coupled to a first voltage less than the second voltage;
    wherein the driving transistors are amorphous silicon thin film transistors (a-Si TFT), and the relationship between an equivalent channel width/length (W/L) ratio R of the driving transistor and the number of driving transistors N is $$R \geq \frac{10}{N}.$$

12. The pixel structure as claimed in claim 11, wherein the second voltage is a ground or a high voltage.

13. An active matrix organic light-emitting diode (OLED) display, comprising:
    a panel, comprising a plurality of pixels, each comprising a first transistor having a gate terminal coupled to a scan signal and a drain terminal coupled to a data signal; a storage capacitor having two terminals coupled to a source terminal of the first transistor and a reference node respectively, the reference node having a second voltage; a second transistor having a gate terminal coupled to the source terminal of the first transistor and a drain terminal coupled to the reference node; and an OLED having an anode coupled to a source terminal of the second transistor and a cathode coupled to a first voltage less than the second voltage; wherein the second transistor is an amorphous silicon thin film transistor (a-Si TFT), and an equivalent channel width/length (W/L) ratio of the second transistor exceeds 10.

14. The active matrix OLED display as claimed in claim 13, wherein the second voltage is a high voltage.

15. An active matrix organic light-emitting diode (OLED) display, comprising:

a panel, comprising a plurality of pixels, each comprising a switching transistor having a gate terminal coupled to a scan signal and a drain terminal coupled to a data signal; a storage capacitor having two terminals coupled to a source terminal of the switching transistor and a reference node respectively, the reference node having a second voltage; a plurality of driving transistors connected in parallel, each having a gate terminal coupled to the source terminal of the switching transistor, a drain terminal coupled to the reference node, and a source terminal; and an OLED having an anode coupled to the source terminals of the driving transistor and a cathode coupled to a first voltage less than the second voltage; wherein the driving transistors are amorphous silicon thin film transistors (a-Si TFT), and the relationship between an equivalent channel width/length (W/L) ratio R of the driving transistor and the number of driving transistors N is $$R \geq \frac{10}{N}.$$

16. The active matrix OLED display as claimed in claim 15, wherein the second voltage is a high voltage.

* * * * *